(12) United States Patent
Lin et al.

(10) Patent No.: US 7,298,028 B2
(45) Date of Patent: Nov. 20, 2007

(54) PRINTED CIRCUIT BOARD FOR THERMAL DISSIPATION AND ELECTRONIC DEVICE USING THE SAME

(75) Inventors: Chih-Hsiung Lin, Taipei (TW); Nai-Shung Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 14 days.

(21) Appl. No.: 11/257,593

(22) Filed: Oct. 24, 2005

(65) Prior Publication Data
US 2007/0013045 A1 Jan. 18, 2007

(30) Foreign Application Priority Data
Jul. 14, 2005 (TW) .............................. 94123888 A (51) Int. Cl.
*H01L 23/495* (2006.01)
(52) U.S. Cl. ...................................... 257/675; 257/706
(58) Field of Classification Search ................ 257/706, 257/712, 722
See application file for complete search history.

(56) References Cited

U.S. PATENT DOCUMENTS 3,792,318 A * 2/1974 Fries et al. ................. 257/715
5,773,886 A * 6/1998 Rostoker et al. ............ 257/718
5,933,324 A * 8/1999 Barrett ....................... 361/703
6,373,447 B1 * 4/2002 Rostoker et al. ............ 343/895
6,657,296 B2 * 12/2003 Ho et al. .................... 257/720
6,700,783 B1 * 3/2004 Liu et al. .................... 361/704
7,131,487 B2 * 11/2006 Chang et al. ........... 165/104.33

FOREIGN PATENT DOCUMENTS

| CN | 1430254 | 7/2003 |
| EP | 0465693 | 7/1990 |
| JP | 09008482 | 1/1997 |
| JP | 2004095760 | 3/2004 |
| JP | 2004247396 | * 9/2004 |
| TW | 524388 | 3/2003 |

OTHER PUBLICATIONS

Taiwan Office Action mailed Aug. 24, 2006.
China Office Action mailed Feb. 2, 2007.

* cited by examiner

*Primary Examiner*—W. David Coleman
*Assistant Examiner*—Ankush Singal
(74) *Attorney, Agent, or Firm*—Thomas, Kayden, Horstemeyer & Risley (57) ABSTRACT

A printed circuit board (PCB) for a package substrate of a multi-package module (MPM). The PCB comprises a substrate and a heat sink thereon. The heat sink comprises a first portion under the package substrate of the MPM. The heat sink further comprises a second portion adjacent to the first portion, comprising at least one fin.

18 Claims, 8 Drawing Sheets

PRINTED CIRCUIT BOARD FOR THERMAL DISSIPATION AND ELECTRONIC DEVICE USING THE SAME

BACKGROUND

The invention relates to a circuit board and in particular to a printed circuit board (PCB) for a multi-package module for thermal dissipation and an electronic device using the same.

Demand for small, high performance portable electronic products such as mobile phones, protable computers, and the like have driven the industry to increase integration on semiconductor dice. Accordingly, the industry is achieving high integration by turning to 3D packaging by combining assembly technologies including wire bonding or flip chip to stack die packages to form a multi-package module (MPM).

MPM, a current assembly technology, integrates different dice functions, such as microprocessors or memory, logic, optic ICs, instead of placing individual packages onto a large printed circuit board (PCB). MPM, however, has a much higher power density than an individual single die package. Thus, thermal management is a key factor in its successful development.

Figure 1:
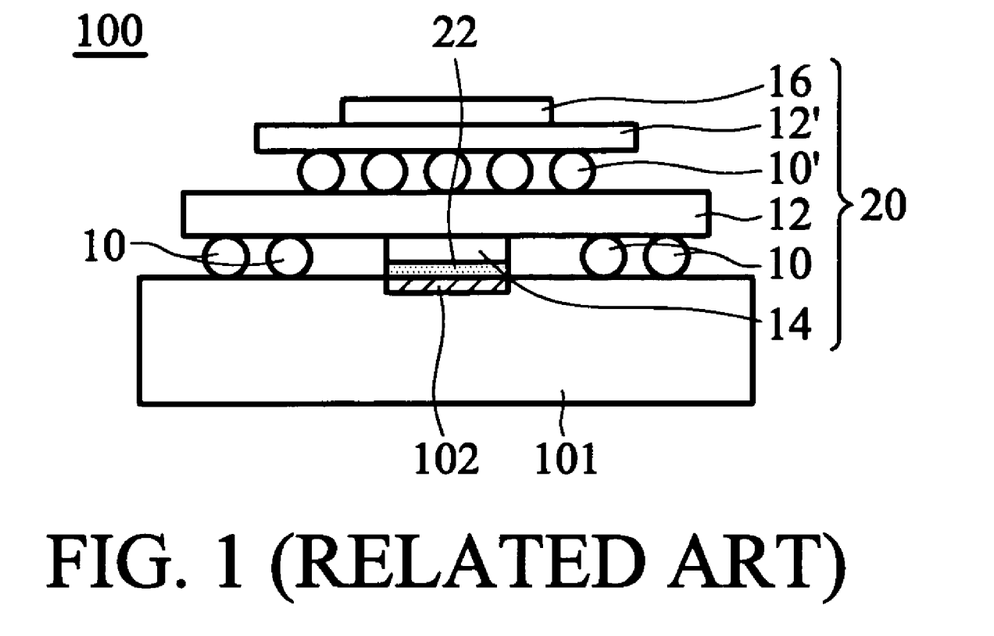
FIG. 1 is a cross-section of a conventional electronic device with a multi-package module.

FIG. 1 illustrates a conventional electronic device 100 with an MPM. The electronic device 100 comprises an MPM 20 mounted on a PCB 101, comprising a package substrate 12. The upper and lower surfaces of the package substrate 12 have dice 16 and 14 with different functions thereon, respectively, to create the MPM 20. For example, the die 16 is mounted on the upper surface of the package substrate 12 by bumps (or solder balls) of a package substrate 12'. The die 14 is mounted on the lower surface of the package substrate 12 by flip chip. The lower surface of the package substrate 12 comprises a plurality of bumps 10 thereon to correspondingly connect to the bonding pads (not shown) on the PCB 101. In the MPM 20, heat generated from the die 16 can be dissipated by radiation and convection. The gap g between the die 14 and the PCB 101 is too narrow, however, to dissipate the generated heat by radiation and convection. Accordingly, the heat generated from the die 14 is dissipated by conduction only. Typically, a metal layer 102 is disposed on the PCB 101 corresponding to the die 14 and connected to the die 14 by a heat conductive paste 22. That is, thermal dissipation is accomplished by a thermal conductive path created by the heat conductive paste 22, the metal layer 102 and the PCB 101.

Passive cooling, however, cannot provide a higher rate of adequate thermal dissipation for high power dice which may generate higher heat. That is, generated heat cannot be rapidly dissipated from dice by conducting the heat to the PCB through the heat conductive paste and the metal layer.

SUMMARY

A printed circuited board for thermal dissipation and an electronic device using the same are provided. An embodiment of a printed circuit board (PCB) for thermal dissipation comprises a substrate and a heat sink thereon. The heat sink comprises a first portion under the package substrate of the MPM. The heat sink further comprises a second portion adjacent to the first portion, comprising at least one fin.

An exemplary embodiment of an electronic device comprises a package substrate, comprising a substrate having a die region and at least one thermal channel region outwardly extending to an edge of the substrate from the die region and an array of bumps arranged on the substrate except in the die and thermal channel regions. A circuit board comprises a plurality of bonding pads correspondingly connecting to the bumps. A heat sink is disposed between the circuit board and the package substrate, comprising a first portion corresponding to the die region and a second portion adjacent to the first portion, extending to the circuit board outside the package substrate along the thermal channel region and comprising at least one fin.

Another embodiment of an electronic device comprises a package substrate, comprising a substrate having a die region and at least one thermal channel region outwardly extending to an edge of the substrate from the die region and an array of bumps arranged on the substrate except in the die and thermal channel regions. A circuit board comprises a plurality of bonding pads correspondingly connecting to the bumps and a metal layer underlying the package substrate. The metal layer comprises a first portion corresponding to the die region, a second portion adjacent to the first portion, extending to the circuit board outside the package substrate along the thermal channel region and comprising at least one fin, and a third portion adjacent to the end of the second portion outside the package substrate.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 2A:
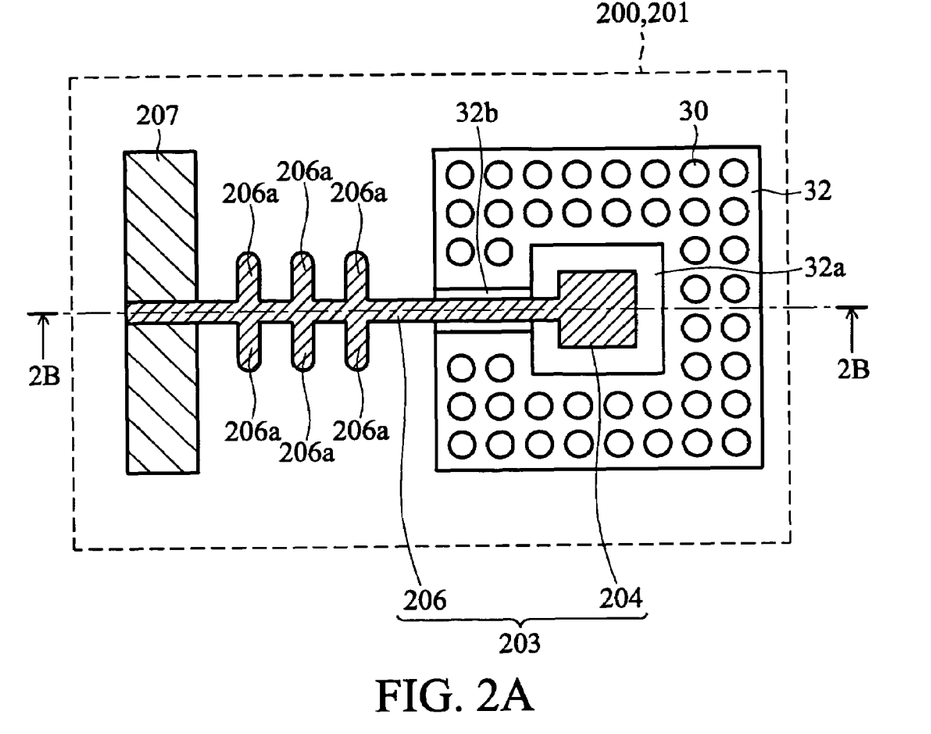
FIG. 2A is a bottom planar view of an embodiment of electronic device with a multi-package module.
Figure 2B:
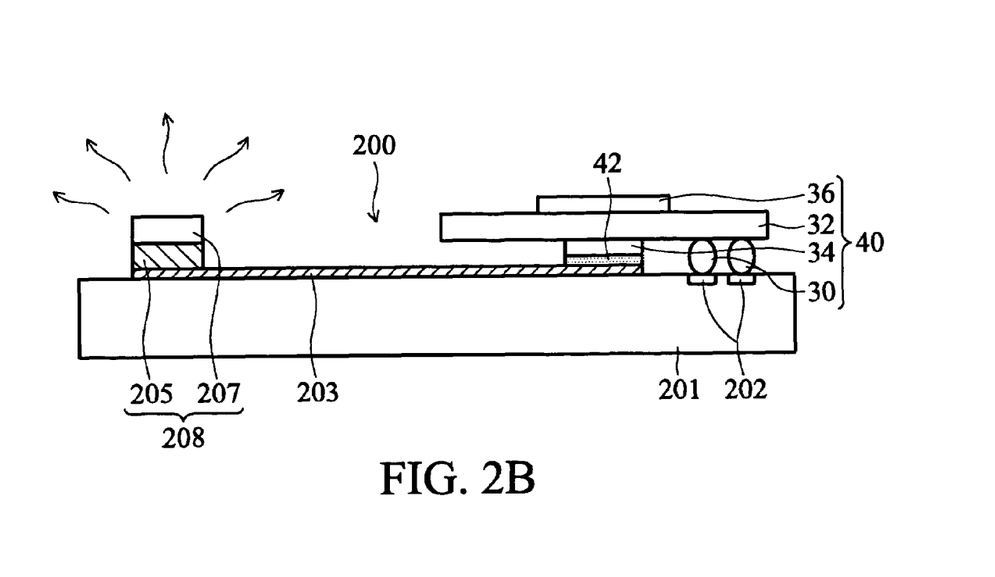
FIG. 2B is a cross-section along line 2B-2B of FIG. 2A.

An electronic device for multi-package module (MPM) for thermal dissipation will now be described in greater detail. FIGS. 2A and 2B illustrate an embodiment of an electronic device with an MPM, wherein FIG. 2A is a bottom planar view of the electronic device and FIG. 2B is a cross-section along line 2B-2B of FIG. 2A. The electronic device comprises MPM 40, a circuit board 200 and a heat sink 203.

Figure 3A:
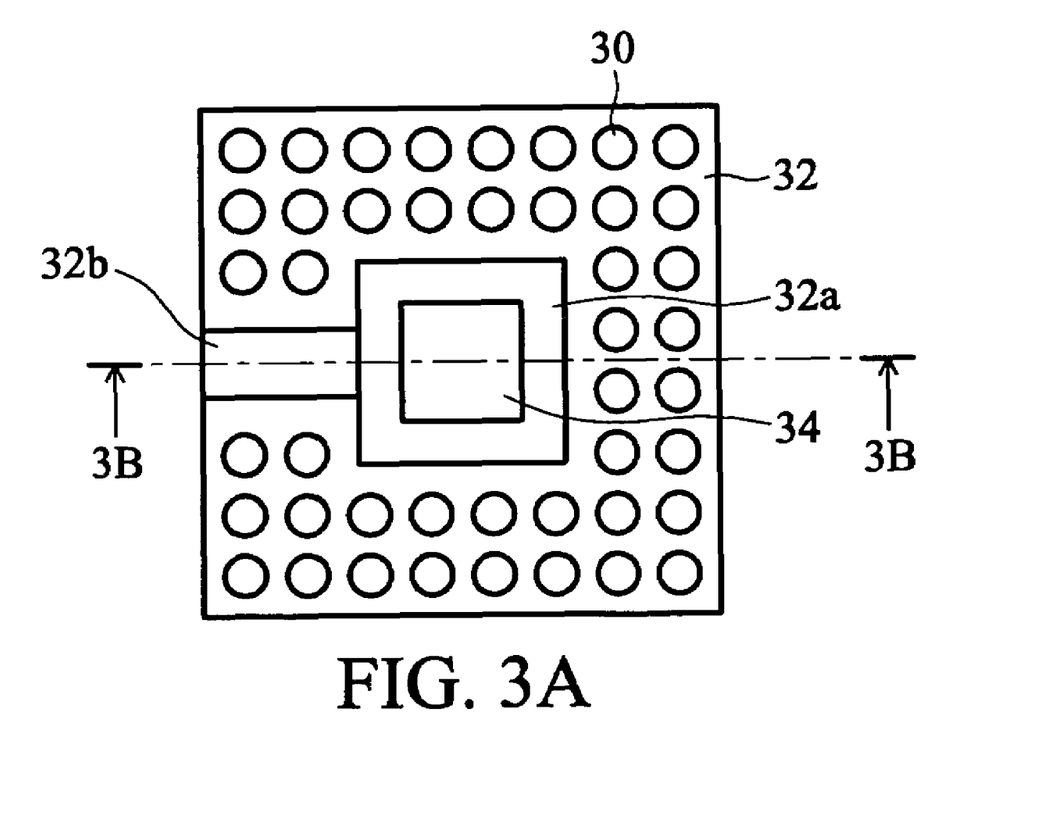
FIG. 3A is a bottom planar view of an embodiment of a multi-package module.
Figure 3B:
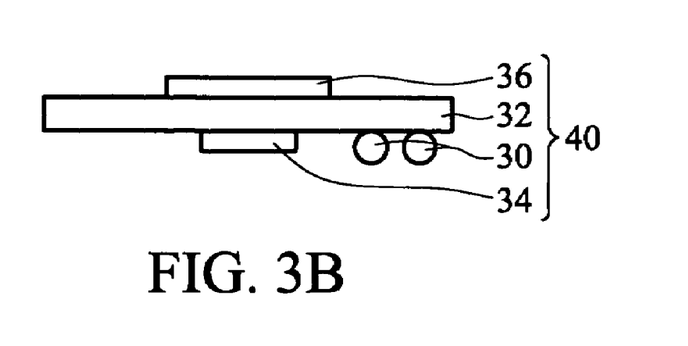
FIG. 3B is a cross-section along line 3B-3B of FIG. 3A.
Figure 3C:
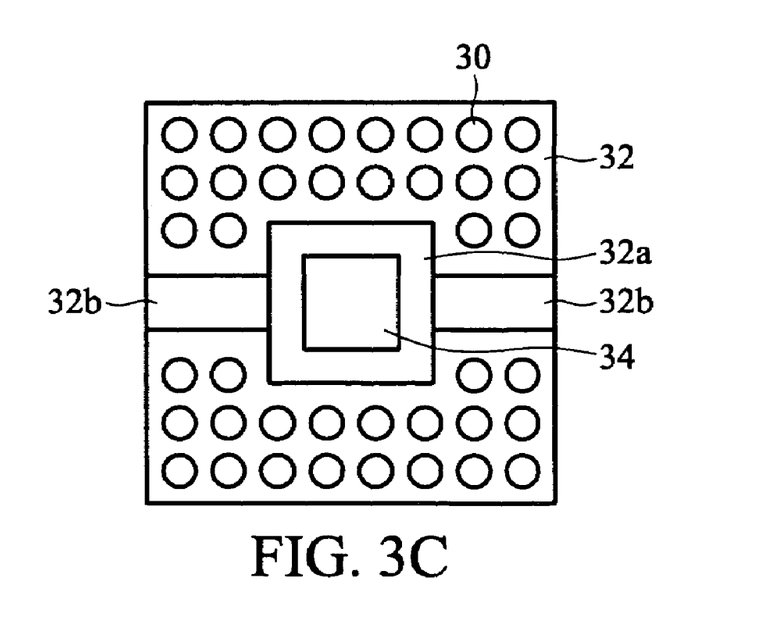
FIG. 3C is a bottom planar view of an embodiment of a multi-package module.

FIGS. 3A and 3B illustrate an exemplary embodiment of an MPM 40, wherein FIG. 3A is a bottom planar view of the MPM 40 and FIG. 3B is a cross-section along line 3B-3B of FIG. 3A. The MPM 40 comprises a package substrate 32. The lower surface of the package substrate 32 has a die region 32*a* and at least one thermal channel region 32*b* and the upper surface of the package substrate 32 also has a die region (not shown). Here, the lower surface represents a surface facing the surface of a circuit board, such as a printed circuit board (PCB) and the upper surface represents the surface opposite to the lower surface. In this embodiment, the package substrate 32 may comprise plastic, ceramic, inorganic or organic material. Typically, the die region 32*a* is substantially at the center of the package substrate 32. Unlike the conventional package substrate, the package substrate 32 comprises at least one thermal channel region 32*b* outwardly extending to an edge of the package substrate 32 from the die region 32*a*. In some embodiments, the thermal channel region 32*b* may extend to an opposite edge of the package substrate 32 across the die region 32*a*, as shown in FIG. 3C. It will be apparent to those skilled in the art that the package substrate 32 may comprise one or more thermal channel regions extending to the edges of the package substrate 32 along different directions from the die region 32*a*. It is to be understood that the invention is not limited to FIGS. 3A and 3C.

Dice 34 and 36 with different functions may be respectively mounted in the die region 32*a* of the lower surface and that of the upper surface of the package substrate 32 by the same or different electronic packages. For example, dice 34 and 36 may respectively be mounted on the package substrate 32 by flip chip or wire bonding.

An array of bumps 30, such as metal bump, solder balls, signal balls or similar, is arranged on the lower surface of the package substrate 32 except in the die region 32*a* and the thermal channel region 32*b*, to transmit signals to external circuits from the dice 34 and 36. The interval between the bumps 30 is narrower than the width of the thermal channel region 32*b*.

A circuit board 200, such as a PCB, comprises a substrate 201 and a plurality of bonding pads 202 thereon, correspondingly connected to the bumps 30, thereby electronically connecting the circuit board 200 and the dice 34 and 36. Typically, the circuit board 200 comprises at least one or more metal layers and at least one or more insulating layers, in which the metal layer may serve as a signal layer, a power layer, and/or a grounding layer. In order to simplify the diagram, a flat substrate 201 is depicted.

Figure 2C:
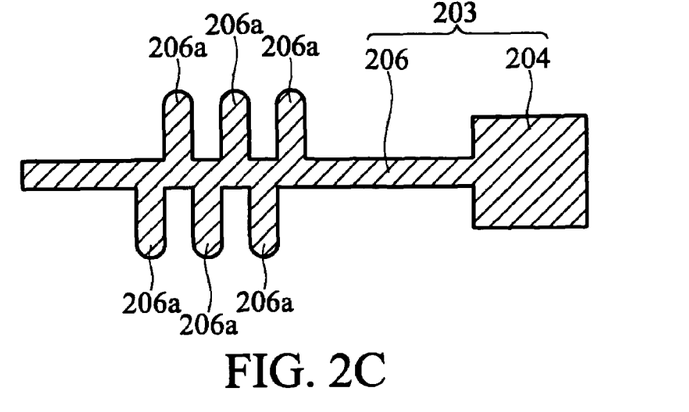
FIG. 2C is a planar view of an embodiment of a heat sink with alternately arranged fins.
Figure 2D:
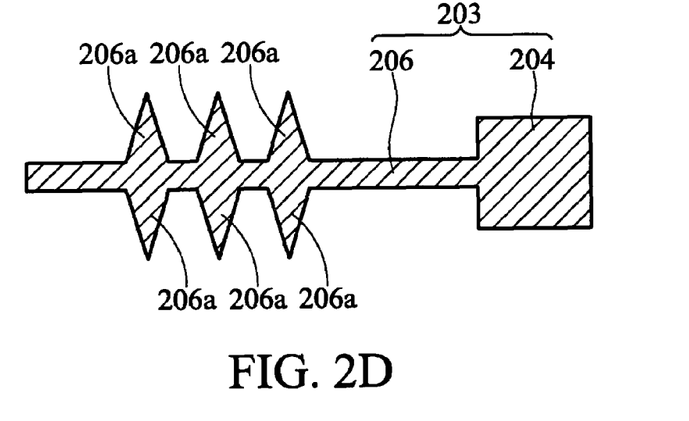
FIG. 2D is a planar view of an embodiment of a heat sink with triangular fins.
Figure 2E:
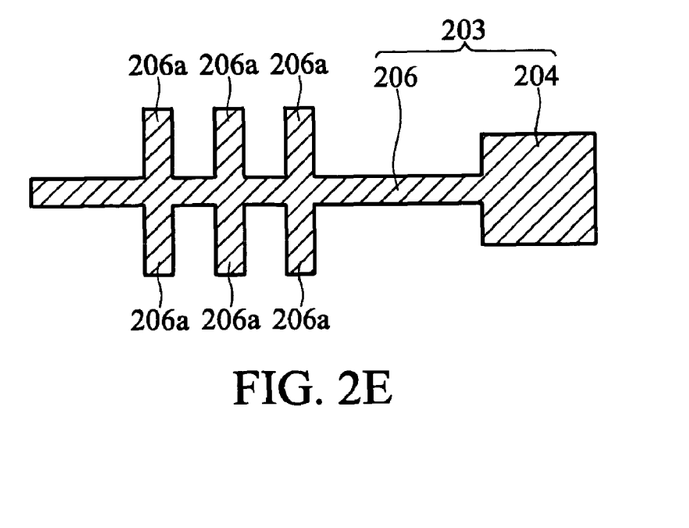
FIG. 2E is a planar view of an embodiment of a heat sink with rectangular fins.

A heat sink 203 is disposed on the circuit board 200 and between the circuit board 200 and the package substrate 32, comprising first and second portions 204 and 206. The first portion 204 corresponds to the die region 32*a* of the package substrate 32 and connected to the die 34 by a heat conductive paste 42. The second portion 206 is adjacent to the first portion 204 and extends outside the package substrate 32 along the thermal channel region 32*b*, in which the second portion 206 on the circuit board 200 outside the package substrate 32 comprises at least one fin 206*a*. For example, the second portion 206 on the circuit board 200 outside the package substrate 32 comprises a plurality of round fins 206*a* which are symmetrically arranged on both sides of the second portion 206. Moreover, the fins 206 extend substantially parallel to the surface of the circuit board 200. In some embodiments, the fins 206*a* may be alternately arranged on both sides of the second portion 206, as shown by the heat sink 203 in FIG. 2C. Additionally, in some embodiments, the fins 206*a* may be triangular (as shown in FIG. 2D), rectangular (as shown in FIG. 2E) or polygon (not shown). It will be apparent to those skilled in the art that the triangular or rectangular fins 206*a* may be alternately arranged on both sides of the second portion 206 and it is to be understood that the invention is not limited to FIGS. 2D and 2E. In this embodiment, the heat sink 203 comprises gold, silver or copper. Moreover, the first portion 204 of the heat sink 203 may partially or fully overlap the die 34 or the die region 32*a*. Here, only an example of the full overlap is depicted. Note that the shape of the heat sink 203 may be varied with the design of the thermal channel region 32*b*.

A thermal dissipation module 208 is disposed on the end of the second portion 206 of the heat sink 203 outside the package substrate 32, providing active thermal dissipation. In this embodiment, the thermal dissipation module 208 may comprise a fan 207 and an underlying heat dissipating component 205, such as a heat plate or pipe.

According to the electronic device of the invention, the thermal channel region 32*b* can be formed by rearranging the bumps 30. Moreover, since the heat sink 203 may extend outside the package substrate 32 along the thermal channel region 32*b*, the heat generated from the die 34 on the lower surface of the package substrate 32 can be dissipated by radiation and convection through the fins 206*a* for passive cooling. At the same time, the heat can be effectively and rapidly dissipated to the ambient environment by radiation, convection and conduction through the dissipating component 205, as shown by the arrows in FIG. 3B. Additionally, if the die 34 is a high power die, the heat can be dissipated quickly by the fan 207 for active cooling. Compared to conventional thermal dissipation by conduction of the circuit board, the electronic device with MPM 40 of the invention has better thermal dissipation and a higher thermal dissipation rate.

Figure 4A:
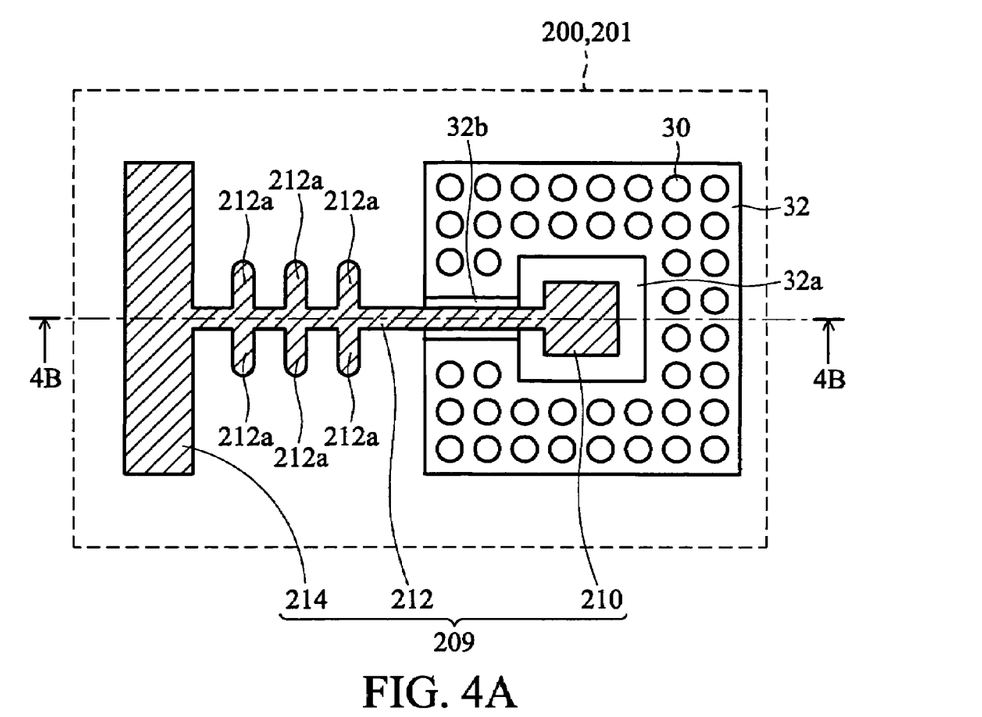
FIG. 4A is a bottom planar view of an embodiment of electronic device with a multi-package module.
Figure 4B:
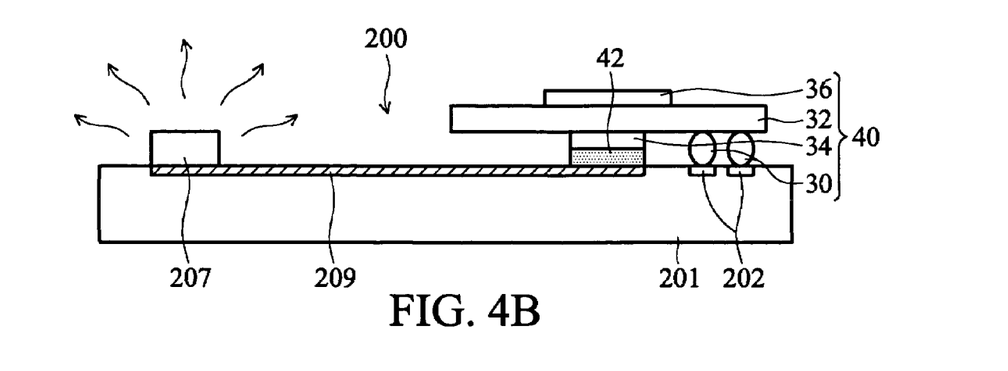
FIG. 4B is a cross-section along line 4B-4B of FIG. 4A.
Figure 4C:
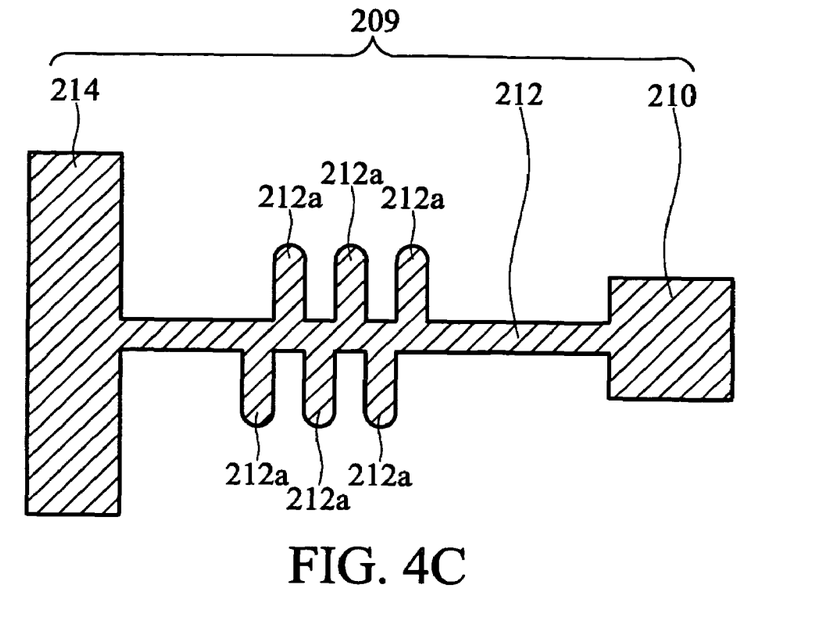
FIG. 4C is a planar view of an embodiment of a metal layer with alternately arranged fins.
Figure 4D:
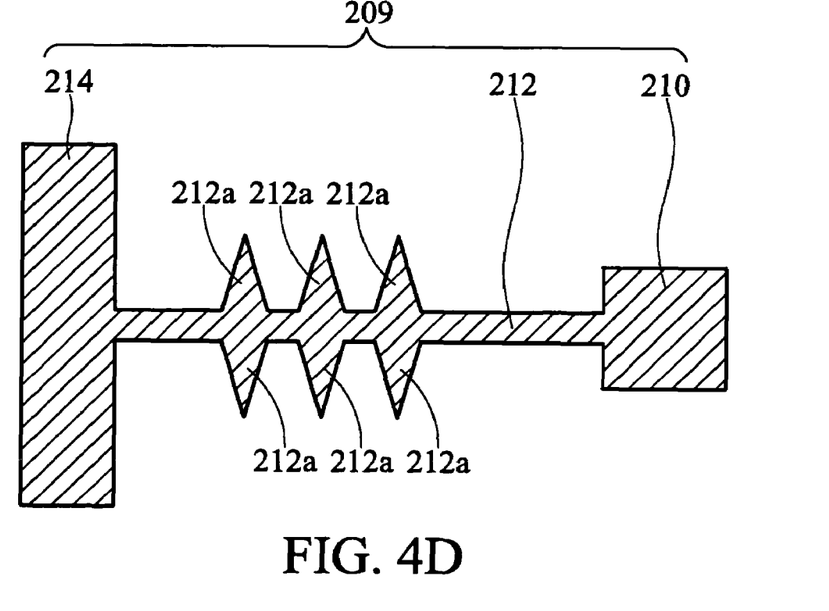
FIG. 4D is a planar view of an embodiment of a metal layer with triangular fins.
Figure 4E:
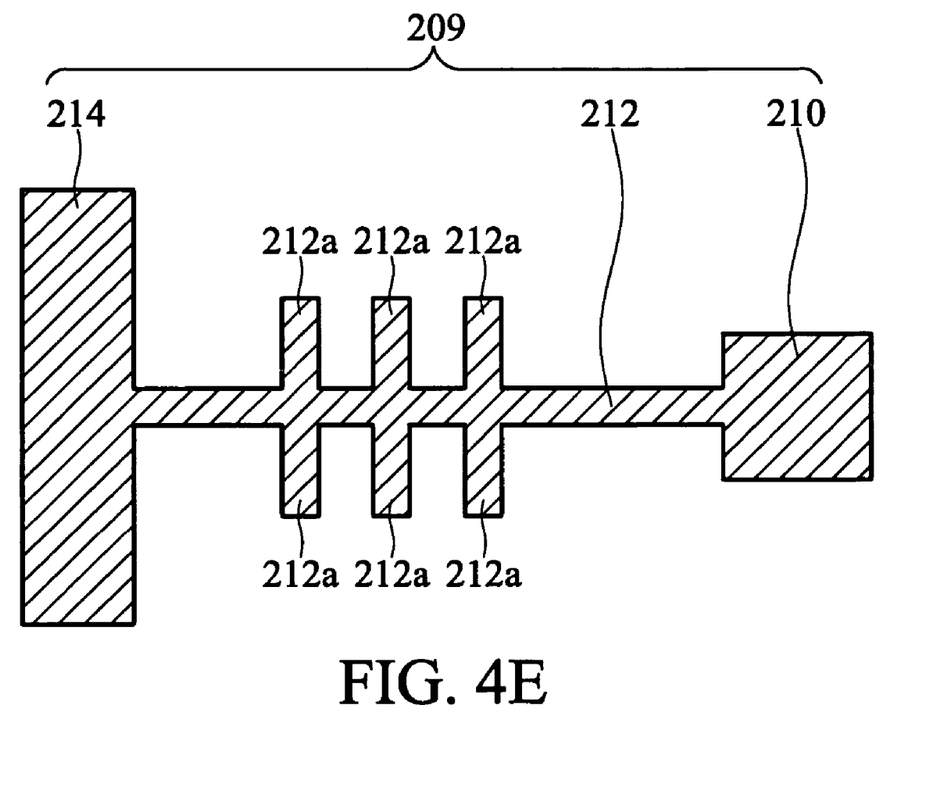
FIG. 4E is a planar view of an embodiment of a metal layer with rectangular fins.

FIGS. 4A and 4B illustrate an embodiment of an electronic device with an MPM, wherein FIG. 4A is a bottom planar view of the electronic device and FIG. 4B is a cross-section along line 4B-4B of FIG. 4A. The same reference numbers as FIGS. 2A and 2B are used, wherefrom like descriptions are omitted. Unlike the embodiment of FIGS. 2A and 2B, the thermal conductive path is formed by defining a metal layer 209 of the circuit board 200. Here, the circuit board 200, such as a PCB, comprises a substrate 201 and a metal layer 209 thereon. In this embodiment, the metal layer 209 comprises a first portion 210, a second portion 212 and a third portion 214. The first portion 210 of the metal layer 209 is under the die region 32*a* and is connected to the die 34 by a heat conductive paste 42. The second portion 212 of the metal layer 209 is adjacent to the first portion 210 and extends outside the package substrate 32 along the thermal channel region 32*b*, in which the second portion 212 on the circuit board 200 outside the package substrate 32 comprises at least one fin 212*a*. The third portion 214 of the metal layer 209 is adjacent to the end of the second portion 212 on the circuit board 200 outside of the package substrate 32. For example, the second portion 212 on the circuit board 200 outside the package substrate 32 comprises a plurality of round fin 212*a* which are symmetrically arranged on both sides of the second portion 212. Moreover, the fins 212 extend-substantially parallel to the surface of the circuit board 200. In some embodiments, the fins 212*a* may be alternately arranged on both sides of the second portion 212, as shown by the metal layer 209 in FIG. 4C. Additionally, in some embodiments, the fins 206*a* may be triangular (as shown in FIG. 4D), rectangular (as shown in FIG. 4E) or polygon (not shown) It will be apparent to those skilled in the art that the triangular or rectangular fins 212*a* may be alternately arranged on both sides of the second portion 212 and it is to be understood that the invention is not limited to FIGS. 4D and 4E. In this embodiment, the metal layer 209 comprises gold, silver or copper. Moreover, the first portion 204 of the metal layer 209 may partially or fully overlap the die 34 or the die region 32a. Here, only an example of the full overlap is depicted. Note that the shape of the metal layer 209 may be varied with the design of the thermal channel region 32b. The first and second portions 210 and 212 of the metal layer 209 serve as a heat sink to conduct heat generated from the die 34 outside the package substrate 32. The third portion 214 of the metal layer 209 serves as a heat dissipating component to dissipate heat to the ambient environment by a fan 207 disposed thereon, as shown by the arrows in FIG. 4B.

In this embodiment, since the metal layer 209 may extend outside the package substrate 32 along the thermal channel region 32b, the heat generated from the die 34 on the lower surface of the package substrate 32 can be effectively and rapidly dissipated to the ambient environment by radiation, convection and conduction. Compared to the conventional thermal dissipation by conduction of the circuit board, the electronic device with MPM 40 has better thermal dissipation and a higher thermal dissipation rate. Moreover, since the metal layer 209 is included in the circuit board 200, no additional heat sink or heat dissipating component are required.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
   a package substrate, comprising:
   a substrate having a die region and at least one thermal channel region outwardly extending to an edge of the substrate from the die region; and
   an array of bumps arranged on the substrate except in the die and thermal channel regions;
   a circuit board comprising a plurality of bonding pads correspondingly connected to the bumps; and
   a heat sink disposed between the circuit board and the package substrate, comprising:
   a first portion corresponding to the die region; and
   a second portion adjacent to the first portion, extending to the circuit board outside the package substrate along the thermal channel region, wherein the second portion comprises at least one fin; and
   a die disposed in the die region and facing the first portion of the heat sink.

2. The electronic device as claimed in claim 1, wherein the fin extends substantially parallel to the surface of the circuit board.

3. The electronic device as claimed in claim 1, further comprising a thermal dissipation module disposed on the end of the second portion of the heat sink outside the package substrate.

4. The electronic device as claimed in claim 3, wherein the thermal dissipation module comprises a heat plate or pipe contacted to the second portion of the heat sink.

5. The electronic device as claimed in claim 1, wherein the heat sink comprises gold, silver or copper.

6. The electronic device as claimed in claim 1, wherein the fin is round, triangular, rectangular or polygonal.

7. The electronic device as claimed in claim 1, wherein the second portion of the heat sink comprises two opposite sides and a plurality of fins are symmetrically or alternately arranged on the opposite sides of the second portion.

8. The electronic device as claimed in claim 1, wherein the first portion of the heat sink partially or completely overlaps the die region.

9. An electronic device, comprising:
   a package substrate, comprising:
   a substrate having a die region and at least one thermal channel region outwardly extending to an edge of the substrate from the die region; and
   an array of bumps arranged on the substrate except in the die and thermal channel regions;
   a circuit board, comprising:
   a plurality of bonding pads correspondingly connected to the bumps; and
   a metal layer underlying the package substrate, comprising:
   a first portion corresponding to the die region;
   a second portion adjacent to the first portion, extending to the circuit board outside the package substrate along the thermal channel region, wherein the second portion outside the package substrate comprises at least one fin; and
   a third portion adjacent to the end of the second portion outside the package substrate.

10. The electronic device as claimed in claim 9, wherein the fin extends substantially parallel to the surface of the circuit board.

11. The electronic device as claimed in claim 9, wherein the metal layer comprises gold, silver or copper.

12. The electronic device as claimed in claim 9, wherein the fin is round, triangular, rectangular or polygonal.

13. The electronic device as claimed in claim 9, wherein the second portion of the metal layer comprises two opposite sides and a plurality of fins are symmetrically or alternately arranged on the opposite sides of the second portion.

14. The electronic device as claimed in claim 9, wherein the first portion of the metal layer partially or completely overlaps the first die.

15. A printed circuit board for a package substrate of a multi-package module having a die disposed on a lower surface thereof, comprising:
   a printed circuit board; and
   a heat sink on the printed circuit board, comprising:
   a first portion under the package substrate, such that the die faces the first portion of the heat sink; and
   a second portion adjacent to the first portion, comprising two opposite sides and a plurality of fins symmetrically or alternately arranged on the opposite sides of the second portion.

16. The printed circuit board as claimed in claim 15, wherein the fin extends substantially parallel to the surface of the printed circuit board.

17. The printed circuit board as claimed in claim 15, wherein the fin is round, triangular, rectangular or polygonal.

18. The printed circuit board as claimed in claim 15, wherein the heat sink comprises metal.

* * * * *